(12) United States Patent
Cheah et al.

(10) Patent No.: US 11,540,395 B2
(45) Date of Patent: Dec. 27, 2022

(54) STACKED-COMPONENT PLACEMENT IN MULTIPLE-DAMASCENE PRINTED WIRING BOARDS FOR SEMICONDUCTOR PACKAGE SUBSTRATES

(71) Applicant: Intel Corporation, Santa Clara, CA (US)

(72) Inventors: Bok Eng Cheah, Bukit Gambir (MY); Jackson Chung Peng Kong, Tanjung Tokong (MY); Chin Lee Kuan, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 657 days.

(21) Appl. No.: 16/450,307

(22) Filed: Jun. 24, 2019

(65) Prior Publication Data
US 2020/0128673 A1 Apr. 23, 2020

(30) Foreign Application Priority Data

Oct. 17, 2018 (MY) .............................. PI2018703831

(51) Int. Cl.
*H01L 23/522* (2006.01)
*H05K 1/18* (2006.01)
*H01L 21/768* (2006.01)
*H01L 23/498* (2006.01)

(52) U.S. Cl.
CPC ....... *H05K 1/183* (2013.01); *H01L 21/76807* (2013.01); *H01L 23/49838* (2013.01); *H01L 23/5223* (2013.01); *H05K 2201/10015* (2013.01); *H05K 2201/10159* (2013.01)

(58) Field of Classification Search
CPC . H01L 2224/48227; H01L 2224/73265; H01L 2924/14; H01L 2924/15311; H01L 2225/06568; H05K 1/183
See application file for complete search history.

(56) References Cited

U.S. PATENT DOCUMENTS

| | | | | |
|---|---|---|---|---|
| 4,843,188 | A * | 6/1989 | Patterson | H01L 23/5385 174/50.5 |
| 5,652,463 | A * | 7/1997 | Weber | H01L 23/3128 257/667 |
| 5,939,778 | A * | 8/1999 | Boutin | H01L 21/565 257/778 |
| 6,333,856 | B1 * | 12/2001 | Harju | H01L 25/0657 361/764 |
| 6,509,633 | B1 * | 1/2003 | Takagi | H01L 23/057 257/710 |
| 6,674,159 | B1 * | 1/2004 | Peterson | H01L 27/14618 257/434 |
| 7,259,450 | B2 * | 8/2007 | Wood | H01L 25/105 257/725 |
| 7,339,278 | B2 * | 3/2008 | Iksan | H01L 25/0657 257/E21.503 |
| 7,626,827 | B2 * | 12/2009 | Nielsen | H05K 1/183 361/728 |

(Continued)

*Primary Examiner* — Jaehwan Oh
(74) *Attorney, Agent, or Firm* — Schwegman Lundberg & Woessner, P.A.

(57) ABSTRACT

A multiple-damascene structure is located below a semiconductor device footprint on a printed wiring board, where the structure includes multiple recesses that containing useful devices coupled to a semiconductive device.

17 Claims, 7 Drawing Sheets

(56) References Cited

U.S. PATENT DOCUMENTS

| | | | | |
|---|---|---|---|---|
| 7,682,869 B2 * | 3/2010 | Hong | | H01L 23/13 |
| | | | | 438/126 |
| 7,977,579 B2 * | 7/2011 | Bathan | | H01L 23/4334 |
| | | | | 29/832 |
| 8,354,743 B2 * | 1/2013 | Jensen | | H01L 25/0657 |
| | | | | 257/777 |
| 8,823,160 B2 * | 9/2014 | Ha | | H01L 25/105 |
| | | | | 257/690 |
| 9,063,307 B2 * | 6/2015 | Yabre | | H05K 1/0274 |
| 9,153,863 B2 * | 10/2015 | Nair | | H01Q 1/38 |
| 9,155,198 B2 * | 10/2015 | Dakhiya | | H01L 23/5384 |
| 9,269,831 B2 * | 2/2016 | Ehrenpfordt | | B81B 7/0061 |
| 10,103,113 B2 * | 10/2018 | Ko | | H05K 3/429 |
| 10,187,996 B2 * | 1/2019 | Swaminathan | | H05K 1/113 |
| 10,553,452 B2 * | 2/2020 | Hong | | H01L 21/6835 |
| 10,678,073 B2 * | 6/2020 | Krasulick | | G02F 1/0121 |
| 2006/0043581 A1 * | 3/2006 | Prokofiev | | H01L 23/49838 |
| | | | | 257/691 |
| 2006/0097370 A1 * | 5/2006 | Bartley | | H01L 23/49838 |
| | | | | 257/E23.07 |
| 2007/0278644 A1 * | 12/2007 | Hsu | | H01L 24/24 |
| | | | | 257/E23.085 |
| 2011/0180919 A1 * | 7/2011 | Jensen | | H01L 25/0657 |
| | | | | 257/774 |
| 2013/0126991 A1 * | 5/2013 | Ehrenpfordt | | B81B 7/0061 |
| | | | | 438/51 |
| 2014/0119689 A1 * | 5/2014 | Yabre | | G02B 6/428 |
| | | | | 385/14 |
| 2014/0218883 A1 * | 8/2014 | Dakhiya | | H05K 1/0284 |
| | | | | 29/830 |
| 2016/0090298 A1 * | 3/2016 | Sengupta | | B81B 7/0048 |
| | | | | 438/51 |
| 2016/0379040 A1 * | 12/2016 | Chang | | G06F 3/041 |
| | | | | 382/124 |
| 2017/0285695 A1 * | 10/2017 | Nair | | H03H 9/587 |
| 2019/0394871 A1 * | 12/2019 | Go | | H05K 1/111 |

* cited by examiner

STACKED-COMPONENT PLACEMENT IN MULTIPLE-DAMASCENE PRINTED WIRING BOARDS FOR SEMICONDUCTOR PACKAGE SUBSTRATES

PRIORITY APPLICATION

This application claims the benefit of priority to Malaysian Application Serial Number PI 2018703831, filed Oct. 17, 2018, which is incorporated herein by reference in its entirety.

FIELD

This disclosure relates to power delivery and decoupling and noise management for semiconductive devices that are mounted above printed wiring boards.

BACKGROUND

Semiconductive device miniaturization during packaging includes challenges to allow passive devices to service the semiconductive devices while continuing to find smaller packages for the semiconductive devices.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Conduction loss for a central-processing unit, and graphic-processor load-line performance are improved by locating power- and noise decoupling solutions close to the semiconductive devices, while preserving expensive, useful real estate in the printed wiring boards at the footprint location of the semiconductive devices. Overall Z-height reductions are part of the solutions, where multiple-damascene structures from the shell side of a printed wiring board, contain components to service semiconductive devices above the land side of the printed wiring board.

Figure 1A:
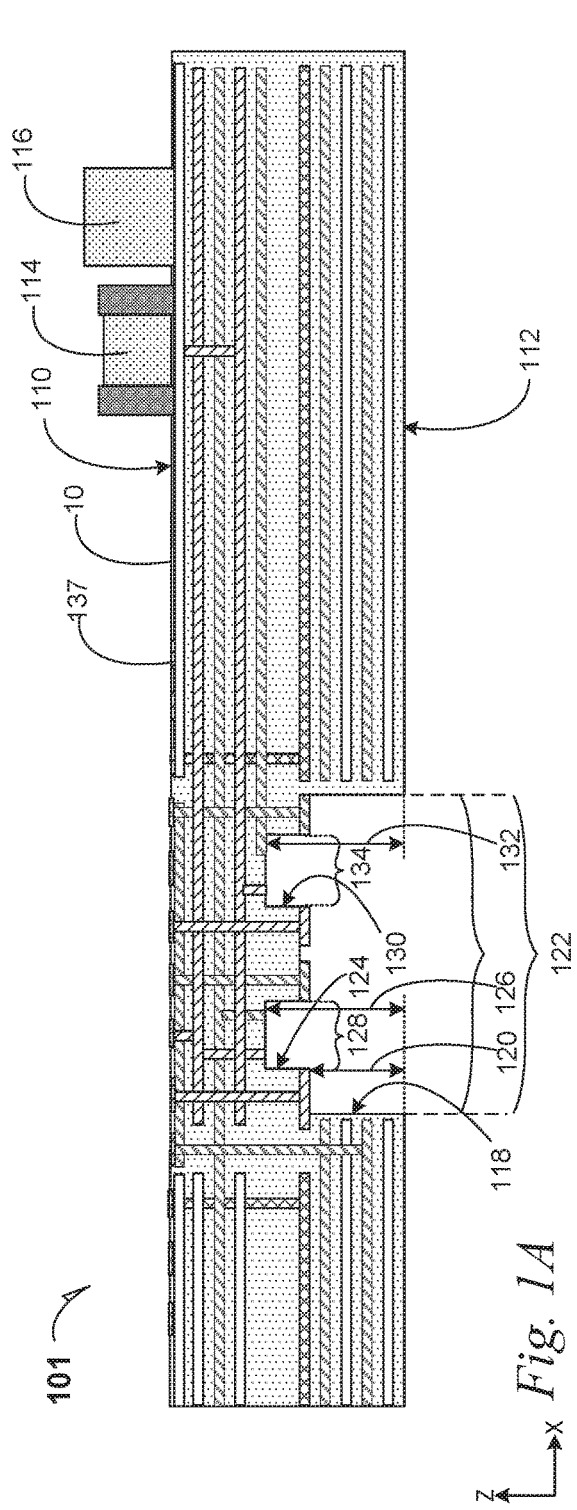
FIG. 1A is a cross-section elevation of a semiconductor device package according to an embodiment.

FIG. 1A is a cross-section elevation of a semiconductor device package 101 according to an embodiment. A printed wiring board 10 includes a land side 110 and a shell side 112. The shell side 112 is usually against an external structure of a computing device such as an outer casing 108 (see FIG. 1B) of a computing platform such as a laptop computer. In an embodiment, the computing device includes an outer shell for a handheld computing platform. In an embodiment, the printed wiring board 10 is a semiconductor package substrate 10, and a ball array is located at the shell side 112 to mate with a board such as a motherboard.

The land side 110 is useful for accepting various components like passive devices such as a capacitor 114 and other components such as a voltage regulator 116.

In an embodiment, a primary recess 118 is formed in the shell side 112 of the printed wiring board 10. The primary recess 118 has a first depth 120 that is measured from the surface level of the shell side 112. In an embodiment, the primary recess 118 has a first depth 120 ranging between 0.1 mm and 1.0 mm. The primary recess 118 has a footprint 122 that is an X-Y dimension, where Y is orthogonal to the plane of the drawing. In an embodiment, the first footprint 122 is useful to place supporting devices for a semiconductor device located above the land side 110 of the printed wiring board 10.

In an embodiment, a subsequent recess 124 is formed within the first footprint 122 and within the primary recess 118. The subsequent recess 124 has a subsequent depth 126 that is measured from the surface level of the shell side 112. The subsequent recess 124 has an effective depth that is the difference of the subsequent depth 126 and the first depth 120. In an embodiment, the subsequent recess 124 has an effective depth ranging between 0.1 mm and 1.0 mm. The subsequent recess 124 also includes a footprint 128 that is an X-Y dimension, where Y is orthogonal to the plane of the drawing. In an embodiment, the subsequent recess 124 includes a footprint 128 ranging between 0.2 mm×0.4 mm and 3.0 mm×5.0 mm.

In an embodiment, a third recess 130 is formed within the first footprint 122 and within the primary recess 118. The third recess 130 has a third depth 132 that is measured from the surface level of the shell side 112. The third recess 130 has an effective depth that is the difference of the third depth 132 and the first depth 120. The third recess 130 also includes a footprint 134 that is an X-Y dimension, where Y is orthogonal to the plane of the drawing. In an embodiment the subsequent recess 124 and the third recess 130 have essentially identical depths and footprints, within manufacturing-deviation allowances for a given printed wiring board design rules. In an embodiment, at least one of a fourth recess and a fifth recess are also formed within the first footprint 122, and the fourth recess and fifth recess are formed in the X-Y plane such as a location orthogonal to the X-Z plane of the drawing. (See FIG. 2).

Figure 2:
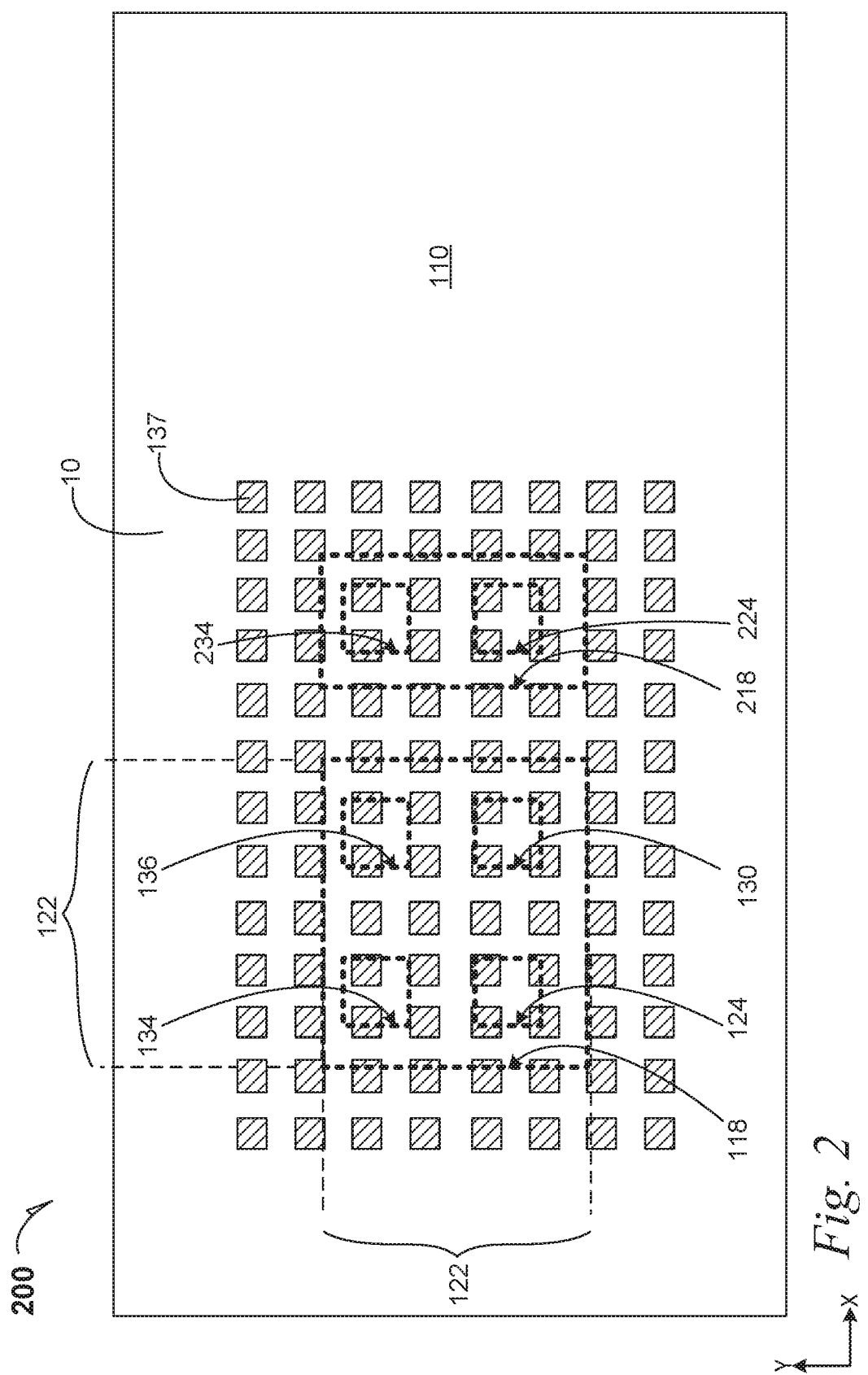
FIG. 2 is a top plan of a printed wiring board such as the printed wiring board depicted in FIG. 1A according to an embodiment.

FIG. 2 is a top plan 200 of a printed wiring board 10 such as the printed wiring board 10 depicted in FIG. 1A according to an embodiment. The land side 110 is visible from the top plan view, and a land-grid array is disposed on the land side 110 of the printed wiring board 10, one bond-pad occurrence of which is indicated with reference number 137.

In an embodiment, at least one of a fourth recess 134 and a fifth recess 136 are also formed within the first footprint 122, and the fourth recess 134 and fifth 136 recess are formed in the X-Y plane such as a location orthogonal to the X-Z plane of the drawing of FIG. 1A.

In an embodiment, the first footprint 122 is symmetrical in at least one X-Y axis with the land-grid array 138. In an embodiment and as illustrated the first footprint 122 is not symmetrical with both X and Y axes of the land-grid array 138, as it is useful for placement of a semiconductor device package substrate in a configuration for closest location of any of the several recesses to sectors of a semiconductive device on the semiconductor device package substrate 10.

Additional to the cross-section view depicted in FIG. 1A, an additional primary recess 218 is indicated in dashed lines, and two further recesses 224 and 234, analogous to the positions of the respective subsequent and third recesses 124 and 134, are formed within the subsequent primary recess 218.

Figure 1B:
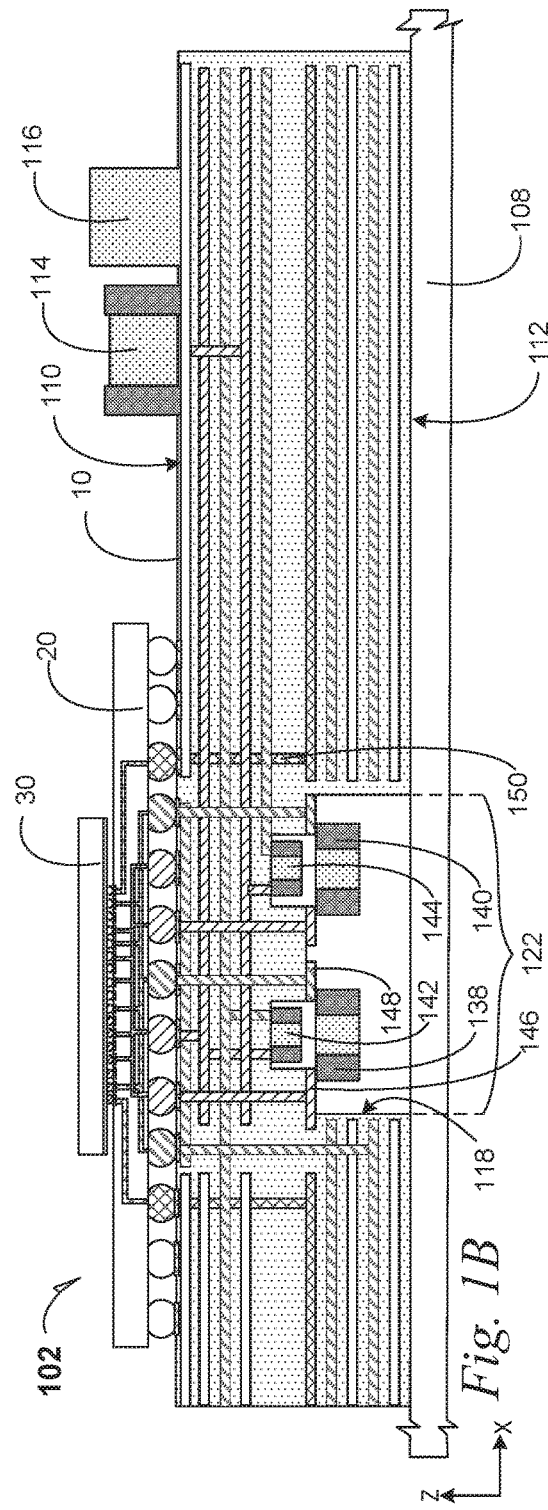
FIG. 1B is a cross-section elevation of the semiconductor device package depicted in FIG. 1A after further assembly according to an embodiment.

FIG. 1B is a cross-section elevation of the semiconductor device package 101 depicted in FIG. 1A after further assembly according to an embodiment. Structures similar to the semiconductor device package 101 depicted in FIG. 1A are preserved or referred to by number. In an embodiment, the semiconductor device package 102 includes the printed wiring board 10, where it is a motherboard 10 and a semiconductor device package substrate 20 is mounted on the land side 110 to at least partially, if not completely, overlap the footprint 122 of the primary recess 118. In an embodiment, a semiconductive device 30 is mounted on a die side of the semiconductor device package substrate 20, and the semiconductive device 30 is at least partially overlapped, if not completely, by the footprint 122 of the primary recess 122.

In an embodiment, a first passive device 138 is seated within the primary recess 118, one electrode of the first passive device 138 coupled to power (VCC), which is illustrated with left-slanted hatching 146, and the other electrode of the first passive device 138 is coupled to ground or source (VSS), which is illustrate with right-slanted hatching 148.

Within the printed wiring board 10 are several power and ground traces and vias, as well as signal vias, which are illustrated with cross-mesh hatching 150. Other incidental traces are illustrated without hatching. The several vias and traces are depicted as projections toward the viewer from several useful X-Z planes, and they are not shorted into crossing vias and traces.

In an embodiment, an alternate first passive device 140 is seated within the primary recess 118, one electrode of the alternate first passive device 140 coupled to power (VCC), which is illustrated with left-slanted hatching, and the other electrode of the alternate first passive device 140 is coupled to ground or source (VSS), which is illustrate with right-slanted hatching.

In an embodiment, a subsequent passive device 142 is seated within the subsequent recess 124 (see FIG. 1A) that is dual-damascene formed within the primary recess 118. Connected to one electrode of the subsequent passive device 142 is a power (VCC) via, which is illustrated with left-slanted hatching, and the other electrode of the subsequent passive device 142 is coupled to ground or source (VSS), which is illustrate with right-slanted hatching.

In an embodiment, a third passive device 144 is seated within the third recess 130 (see FIG. 1A) that is dual-damascene formed within the primary recess 118. Connected to one electrode of the third passive device 144 is a power (VCC) via, which is illustrated with left-slanted hatching, and the other electrode of the subsequent passive device 142 is coupled to ground or source (VSS), which is illustrate with right-slanted hatching.

As illustrated in an embodiment, useful passive devices such as upset capacitors 138 and 140 are seated within the primary recess and within the footprint 122 that is directly below and at least partially overlapped by a semiconductive device 30. As illustrated in an embodiment, useful passive devices such as upset capacitors 142 and 144 are seated within the respective subsequent and third recesses and they are each within the footprint 122 that is directly below a semiconductive device 30. In an embodiment, the passive devices 142 and 144 are smaller physically than at least one of the passive devices 138 and 140. In an embodiment, larger passive devices 114 are still located on the land side 110 of the printed wiring board, but usefully they work in concert with any or each of the several dual-damascene-stacked passive devices 138, 140, 142 and 144, or two or more of them.

Figure 3:
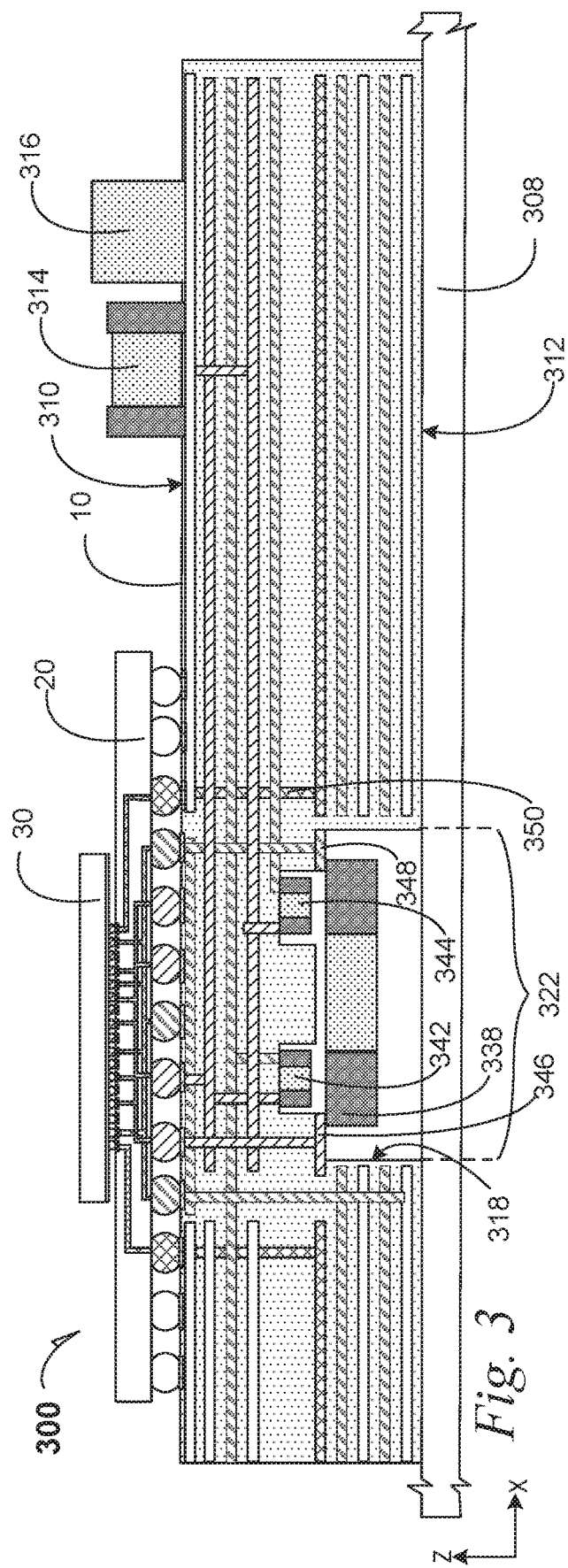
FIG. 3 is a cross-section elevation of a semiconductor device package according to an embodiment.

FIG. 3 is a cross-section elevation of a semiconductor device package 300 according to an embodiment. A printed wiring board 10 includes a land side 310 and a shell side 312. The shell side 312 is usually against an external structure of a computing device such as the outer casing 308 of a computing platform such as a laptop computer. In an embodiment, the outer casing 308 is the shell of a hand-held device such as a tablet. In an embodiment, the printed wiring board 10 is a semiconductor device package substrate 10, and a ball array is located at the shell side 312 to mate with a board such as a motherboard.

The land side 310 is configured for accepting various components like passive devices such as a capacitor 314 and other components such as a voltage regulator 316.

In an embodiment, a primary recess 318 is formed in the shell side 312 of the printed wiring board 10. The primary recess 318 has a first depth that is measured from the surface level of the shell side 312. In an embodiment, the primary recess 318 has a first depth ranging between 0.1 mm and 1.0 mm. The primary recess 318 has a footprint 322 that is an X-Y dimension, where Y is orthogonal to the plane of the drawing. In an embodiment, the first footprint 322 is useful for a semiconductor device location such as a semiconductive device 30 mounted with first-level contacts to a semiconductor device package substrate 20, above the land side 310 of the printed wiring board 10. In an embodiment, the X-Y dimension of the footprint 322 is smaller than the X-Y dimension of the semiconductor device package substrate 20. In an embodiment, the X-Y dimension of the footprint 322 is larger than the X-Y dimension of the semiconductor device package substrate 20.

In an embodiment, a first passive device 338 is seated within the primary recess 318, such as an upset capacitor, where the upset capacitor does not need to be on the land side 310, which may create a less than useful inductance loop. Rather, the first passive device 338 is vertically close to the semiconductive device 30.

In an embodiment, a first passive device 338 is coupled to power (VCC), which is illustrated with left-slanted hatching 346, and the other electrode of the first passive device 338 is coupled to ground or source (VSS), which is illustrate with right-slanted hatching 348.

Within the printed wiring board 10 are several power and ground traces and vias, as well as signal vias, which are illustrated with cross-mesh hatching 350. Other incidental traces are illustrated without hatching. The several vias and traces are depicted as projections toward the viewer from several useful X-Z planes, and they are not shorted into crossing vias and traces.

In an embodiment, a subsequent passive device 342 is seated in a subsequent recess that is also formed within the first footprint 322 as a dual-damascene structure that includes the primary recess 318. The subsequent recess has a subsequent depth that is measured from the surface level of the shell side 312. The subsequent recess has an effective depth that is the difference of the subsequent depth where the subsequent device 342 is seated and the first depth where the first device 338 is seated. In an embodiment, the subsequent recess has an effective depth ranging between 0.1 mm and 1.0 mm. The subsequent recess also includes a footprint that is an X-Y dimension, where Y is orthogonal to the plane of the drawing. In an embodiment, the subsequent recess includes a footprint ranging between 0.2 mm×0.4 mm and 3.0 mm×5.0 mm.

In an embodiment, a third device 344 is seated within a third recess that is formed within the first footprint 322 as a dual-damascene structure that includes the primary recess 318. The third recess has a third depth that is measured from the surface level of the shell side 312. The third recess has an effective depth that is the difference of the third depth and the first depth. The third recess also includes a footprint that is an X-Y dimension, where Y is orthogonal to the plane of the drawing. In an embodiment the subsequent device 342 and the and the third device 344 are seated in respective subsequent and third recesses that have essentially identical depths and footprints, within manufacturing-deviation allowances for a given printed wiring board design rules. In an embodiment, at least one of a fourth recess and a fifth recess are also formed within the first footprint 322, and the fourth recess and fifth recess are formed in the X-Y plane such as a location orthogonal to the X-Z plane of the drawing.

As illustrated in an embodiment, a useful passive device such as the upset capacitor 338 is seated within the primary recess 318 and within the footprint 322 that is directly below a semiconductive device 30. As illustrated in an embodiment, useful passive devices such as upset capacitors 342 and 344 are seated within the respective subsequent and third recesses and they are each within the footprint 322 that is directly below a semiconductive device 30. In an embodiment, larger passive devices 314 are still located on the land side 310 of the printed wiring board, but usefully they work in concert with any or each of the several damascene-stacked devices 338, 342 and 344, or two or more of them.

Figure 4:
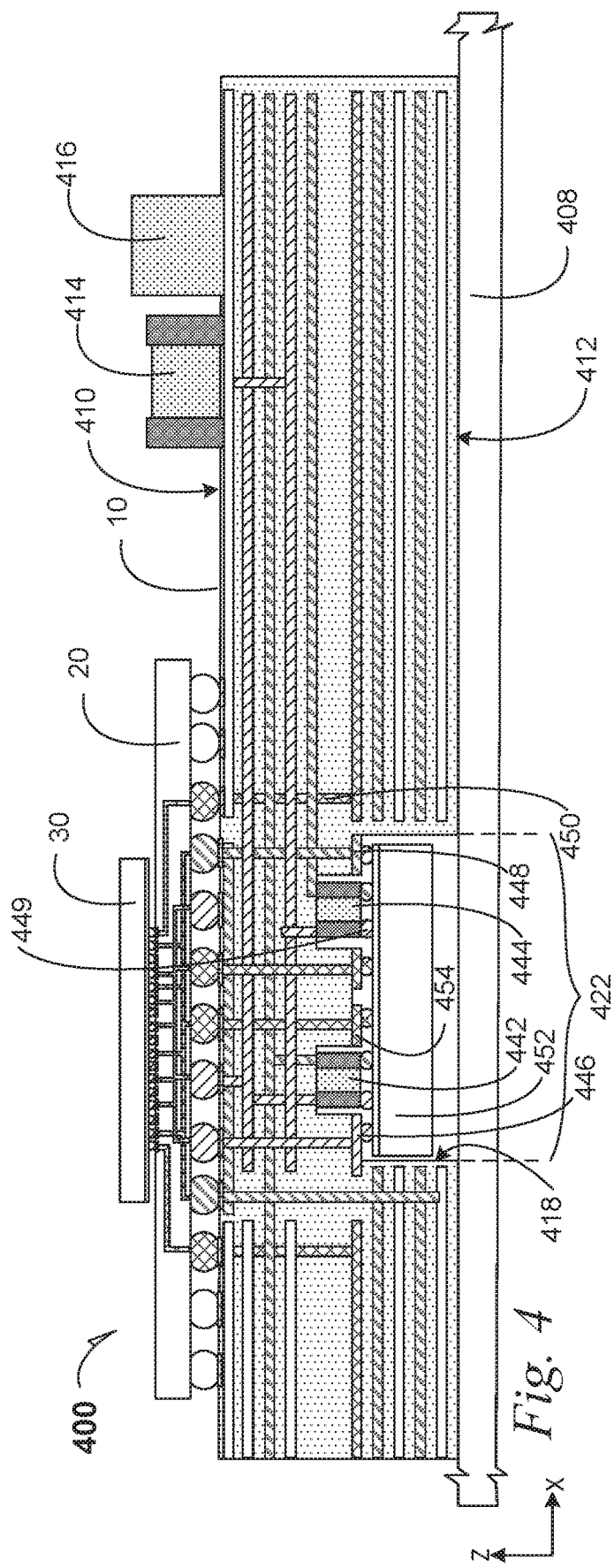
FIG. 4 is a cross-section elevation of a semiconductor device package according to an embodiment.

FIG. 4 is a cross-section elevation of a semiconductor device package 400 according to an embodiment. A printed wiring board 10 includes a land side 410 and a shell side 412. The shell side 412 is usually against an external structure of a computing device such as the outer casing 408 of a computing platform such as a laptop computer. In an embodiment, the printed wiring board 10 is a semiconductor package substrate 10, and a ball array is located at the shell side 412 to mate with a board such as a motherboard.

The land side 410 is configured for accepting various components like passive devices such as a capacitor 414 and other components such as a voltage regulator 416.

In an embodiment, a primary recess 418 is formed in the shell side 412 of the printed wiring board 10. The primary recess 418 has a first depth that is measured from the surface level of the shell side 412. In an embodiment, the primary recess 418 has a first depth ranging between 0.1 mm and 1.0 mm. The primary recess 418 has a footprint 422 that is an X-Y dimension, where Y is orthogonal to the plane of the drawing. In an embodiment, the first footprint 422 is useful for a semiconductor device location such as a semiconductive device 30 mounted with first-level contacts to a semiconductor device package substrate 20, above the land side 410 of the printed wiring board 10. In an embodiment, the X-Y dimension of the footprint 422 is smaller than the X-Y dimension of the semiconductor device package substrate 20. In an embodiment, the X-Y dimension of the footprint 422 is larger than the X-Y dimension of the semiconductor device package substrate 20.

In an embodiment, a first semiconductive device 452 is attached and suspended, opossum style, within the primary recess 418 where the memory die reduces both Z-height and 2.5D footprint on the printed wiring board 10. In an embodiment, the first semiconductive device 452 is a memory device 452 such as a non-volatile memory chip 452 such as a NAND memory device.

In an embodiment, the first semiconductive device 452 is coupled to power (VCC), which is illustrated with left-slanted hatching 446, and the first semiconductive device 452 is also coupled to ground or source (VSS), which is illustrate with right-slanted hatching 448. In an embodiment, signal vias 454 contact an active surface of the opossum die 452.

Within the printed wiring board 10 are several power and ground traces and vias, as well as signal vias, which are illustrated with cross-mesh hatching 450. Other incidental traces are illustrated without hatching. The several vias and traces are depicted as projections toward the viewer from several useful X-Z planes, and they are not shorted into crossing vias and traces.

In an embodiment, a subsequent passive device 442 is seated in a subsequent recess that is also formed within the first footprint 422 as a dual-damascene structure that includes the primary recess 418. The subsequent recess has a subsequent depth that is measured from the surface level of the shell side 412. The subsequent recess has an effective depth that is the difference of the subsequent depth where the subsequent device 442 is seated and the first depth where the first device 452 is seated. In an embodiment, the subsequent recess has an effective depth ranging between 0.1 mm and 1.0 mm. The subsequent recess also includes a footprint that is an X-Y dimension, where Y is orthogonal to the plane of the drawing. In an embodiment, the subsequent recess includes a footprint ranging between 0.2 mm×0.4 mm and 3.0 mm×5.0 mm.

In an embodiment, a third device 444 is seated within a third recess that is formed within the first footprint 422 as a dual-damascene structure that includes the primary recess 418. The third recess has a third depth that is measured from the surface level of the shell side 412. The third recess has an effective depth that is the difference of the third depth and the first depth. The third recess also includes a footprint that is an X-Y dimension, where Y is orthogonal to the plane of the drawing. In an embodiment, the subsequent device 442 and the third device 444 are seated in respective subsequent and third recesses that have essentially identical depths and footprints, within manufacturing-deviation allowances for a given printed wiring board design rules. In an embodiment, the first semiconductive device 452 is coupled directly to the electrodes of the subsequent device 442 and the third device 444 through a plurality of solder bumps 449. In an embodiment, at least one of a fourth recess and a fifth recess are also formed within the first footprint 422, and the fourth recess and fifth recess are formed in the X-Y plane such as a location orthogonal to the X-Z plane of the drawing.

As illustrated in an embodiment, a useful device such as a memory die 452 is attached opossum style within the primary recess 418 and within the footprint 422 that is directly below a semiconductive device 30. As illustrated in an embodiment, useful passive devices such as upset capacitors 442 and 444 are seated within the respective subsequent and third recesses and they are each within the footprint 422 that is directly below a semiconductive device 30. In an embodiment, larger passive devices 414 are still located on the land side 410 of the printed wiring board, but usefully they work in concert with any or each of the several damascene-stacked devices 452, 442 and 444, or two or more of them.

Figure 5:
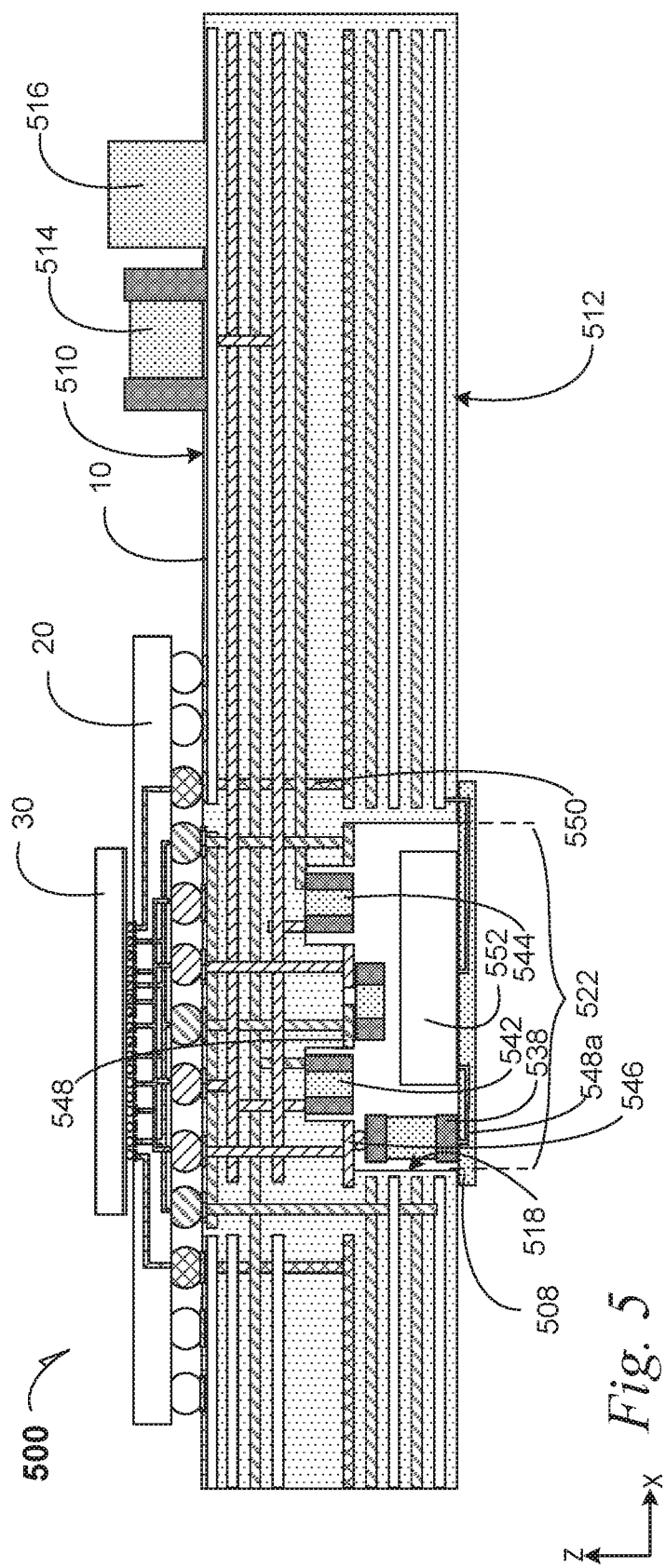
FIG. 5 is a cross-section elevation of a semiconductor device package according to an embodiment.

FIG. 5 is a cross-section elevation of a semiconductor device package 500 according to an embodiment. A printed wiring board 10 includes a land side 510 and a shell side 512. In an embodiment, the printed wiring board 10 is a semiconductor package substrate 10, and a ball array is located at the shell side 512 to mate with a board such as a motherboard.

The land side 510 is configured for accepting various components like passive devices such as a capacitor 514 and other components such as a voltage regulator 516.

In an embodiment, a primary recess 518 is formed in the shell side 512 of the printed wiring board 10. The primary recess 518 has a first depth that is measured from the surface level of the shell side 512. In an embodiment, the primary recess 518 has a first depth ranging between 0.1 mm and 1.0 mm. The primary recess 518 has a footprint 522 that is an X-Y dimension, where Y is orthogonal to the plane of the drawing. In an embodiment, the first footprint 522 is useful for a semiconductor device location such as a semiconductive device 30 mounted with first-level contacts to a semiconductor device package substrate 20, above the land side 510 of the printed wiring board 10. In an embodiment, the X-Y dimension of the footprint 522 is smaller than the X-Y dimension of the semiconductor device package substrate 20. In an embodiment, the X-Y dimension of the footprint 522 is larger than the X-Y dimension of the semiconductor device package substrate 20.

In an embodiment, a first semiconductive device 552 is attached onto a, low-profile flexible cable 508, and a first passive device 538 is orthogonally coupled to both a power rail 546 and a ground source 548a (i.e. in the flexible cable 508) possum style, within the primary recess 518 where the memory die reduces both Z-height and 2.5D footprint on the printed wiring board 10. In an embodiment, the first semiconductive device 552 is a memory device 552 such as a non-volatile memory chip 552 such as a NAND memory device. In an embodiment, the first passive device 538 is orthogonally coupled to both a ground connection 548 (e.g., within printed wiring board 10) and a power rail in the flexible cable 508 possum style, within the primary recess 518 (not shown).

Within the printed wiring board 10 are several power and ground traces and vias, as well as signal vias, which are illustrated with cross-mesh hatching 550. Other incidental traces are illustrated without hatching. The several vias and traces are depicted as projections toward the viewer from several useful X-Z planes, and they are not shorted into crossing vias and traces.

In an embodiment, a subsequent passive device 542 is seated in a subsequent recess that is also formed within the first footprint 522 as a dual-damascene structure that includes the primary recess 518. The subsequent recess has a subsequent depth that is measured from the surface level of the shell side 512. The subsequent recess has an effective depth that is the difference of the subsequent depth where the subsequent device 542 is seated and the first depth where the first passive device 538 is seated. In an embodiment, the subsequent recess has an effective depth ranging between 0.1 mm and 1.0 mm. The subsequent recess also includes a footprint that is an X-Y dimension, where Y is orthogonal to the plane of the drawing. In an embodiment, the subsequent recess includes a footprint ranging between 0.2 mm×0.4 mm and 3.0 mm×5.0 mm.

In an embodiment, a third device 544 is seated within a third recess that is formed within the first footprint 522 as a dual-damascene structure that includes the primary recess 518. The third recess has a third depth that is measured from the surface level of the shell side 512. The third recess has an effective depth that is the difference of the third depth and the first depth. The third recess also includes a footprint that is an X-Y dimension, where Y is orthogonal to the plane of the drawing. In an embodiment the subsequent device 542 and the third device 544 are seated in respective subsequent and third recesses that have essentially identical depths and footprints, within manufacturing-deviation allowances for a given printed wiring board design rules. In an embodiment, at least one of a fourth recess and a fifth recess are also formed within the first footprint 522, and the fourth recess and fifth recess are formed in the X-Y plane such as a location orthogonal to the X-Z plane of the drawing.

As illustrated in an embodiment, a useful device such as a memory die 552 is attached to the flexible cable 508 within the primary recess 518 and within the footprint 522 that is directly below a semiconductive device 30. As illustrated in an embodiment, useful passive devices such as upset capacitors 542 and 544 are seated within the respective subsequent and third recesses and they are each within the footprint 522 that is directly below a semiconductive device 30. In an embodiment, larger passive devices 514 are still located on the land side 510 of the printed wiring board, but usefully they work in concert with any or each of the several damascene-stacked devices 552, 542 and 544, or two or more of them.

Figure 6:
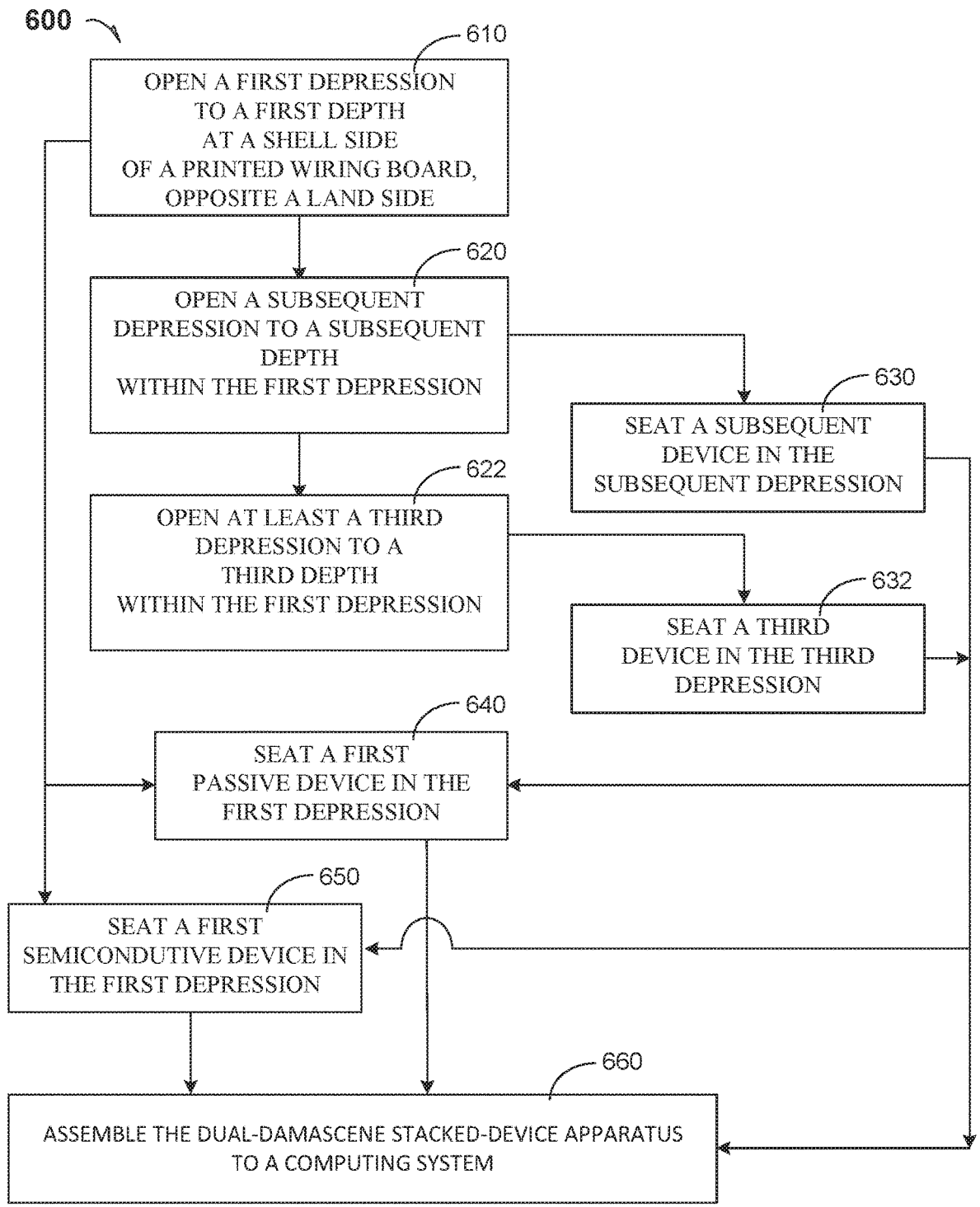
FIG. 6 is a process flow diagram according to an embodiment.

FIG. 6 is a process flow diagram 600 according to an embodiment.

At 610, the process includes opening a primary recess from the shell side of a printed wiring board to a first depth, where a semiconductive device footprint preserves dense design-rule traces and vias on a land side of the printed wiring board.

At 620, the process includes opening a subsequent recess within the first recess, to a subsequent depth, that is deeper than the first depth.

At 622, the process includes opening at least a third recess within the first recess, to a third depth that is deeper than the first depth.

At 630, the process includes seating a subsequent device, in an embodiment a passive device, within the subsequent recess. In an embodiment, the subsequent device is attached to power and ground, when it is a capacitor; one electrode to power and the other electrode to ground.

At 632, the process includes seating at least a third device, in an embodiment a passive device within the third recess. In an embodiment, the third device is attached to power and ground, when it is a capacitor; one electrode to power and the other electrode to ground.

At 640, the process includes seating at least one first device within the first recess. In an embodiment, the first device is a capacitor that is attached to power and ground, when it is a capacitor; one electrode to power and the other electrode to ground. In an embodiment, the at least one first device is a capacitor that is orthogonally coupled within the first recess, and to a flexible cable.

At 650, the process includes seating at least one first semiconductive device within the first recess. In an embodiment, the process includes seating at least one first semiconductive device to a flexible cable, while the first semiconductive device extends within the first recess.

At 660, the process includes assembling the dual-damascene stacked-device apparatus to a computing system.

Figure 7:
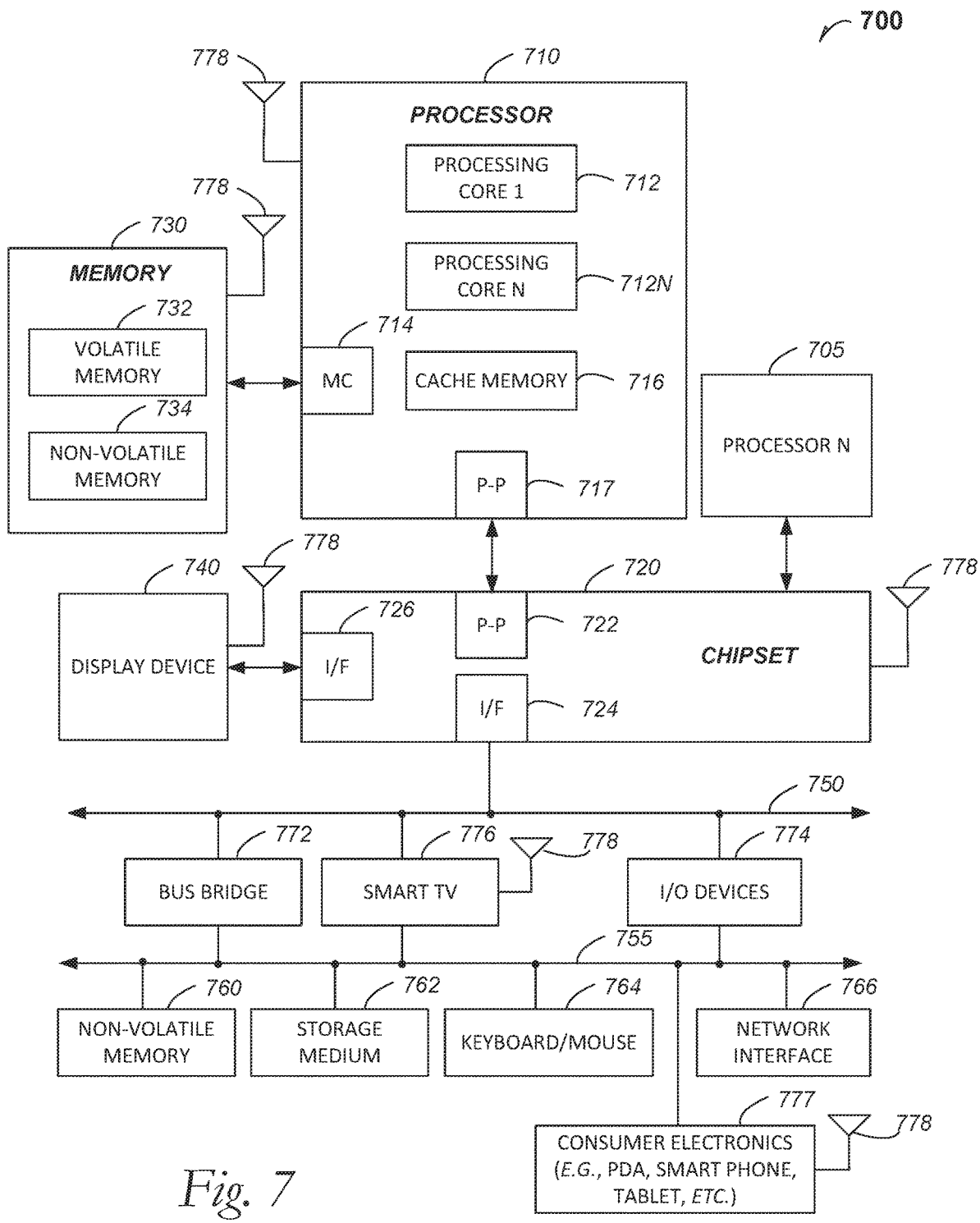
FIG. 7 is included to show an example of a higher-level device application for the disclosed embodiments.

FIG. 7 is included to show an example of a higher-level device application for the disclosed embodiments. The dual-damascene stacked-device apparatus embodiments may be found in several parts of a computing system. In an embodiment, the dual-damascene stacked-device apparatus embodiments can be part of a communications apparatus such as is affixed to a cellular communications tower. In an embodiment, a computing system 700 includes, but is not limited to, a desktop computer. In an embodiment, a system 700 includes, but is not limited to a laptop computer. In an embodiment, a system 700 includes, but is not limited to a tablet. In an embodiment, a system 700 includes, but is not limited to a notebook computer. In an embodiment, a system 700 includes, but is not limited to a personal digital assistant (PDA). In an embodiment, a system 700 includes, but is not limited to a server. In an embodiment, a system 700 includes, but is not limited to a workstation. In an embodiment, a system 700 includes, but is not limited to a cellular telephone. In an embodiment, a system 700 includes, but is not limited to a mobile computing device. In an embodiment, a system 700 includes, but is not limited to a smart phone. In an embodiment, a system 700 includes, but is not limited to an internet appliance. Other types of computing devices may be configured with the microelectronic device that includes dual-damascene stacked-device apparatus embodiments.

In an embodiment, the processor 710 has one or more processing cores 712 and 712N, where 712N represents the Nth processor core inside processor 710 where N is a positive integer. In an embodiment, the electronic device system 700 using a dual-damascene stacked-device apparatus embodiment that includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the dual-damascene stacked-device apparatus embodiments in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. In an embodiment, the chipset 720 is part of a dual-damascene stacked-device apparatus embodiment depicted in FIG. 2. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a dual-damascene stacked-device apparatus embodiment as set forth in this disclosure. The chipset 720 enables the processor 710 to connect to other elements in a dual-damascene stacked-device apparatus embodiment in a system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In an embodiment, the processor 710 and the chipset 720 are merged into a dual-damascene stacked-device apparatus embodiment in a system. Additionally, the chipset 720 connects to one or more buses 750 and 755 that interconnect various elements 774, 760, 762, 764, and 766. Buses 750 and 755 may be interconnected together via a bus bridge 772 such as an embedded multi-die interconnect bridge. In an embodiment, the chipset 720, via interface 724, couples with a non-volatile memory 760, a mass storage device(s) 762, a keyboard/mouse 764, a network interface 766, smart TV 776, and the consumer electronics 777, etc.

In an embodiment, the mass storage device 762 includes, but is not limited to, a solid state drive, a hard disk drive, a universal serial bus flash memory drive, or any other form of computer data storage medium. In one embodiment, the network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV). Ultra Wide Band (UWB), Bluetooth, WiMax, or any form of wireless communication protocol.

While the modules shown in FIG. 7 are depicted as separate blocks within the dual-damascene stacked-device apparatus embodiments in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

To illustrate the dual-damascene stacked-device apparatus embodiments and methods disclosed herein, a non-limiting list of examples is provided herein Example 1 is a printed wiring board including a land side and a shell side, comprising: at least one electrical connection on the land side; a primary recess that extends toward the land side and to a first depth in the shell side, wherein the primary recess includes a first-recess footprint that projects to the land side to encompass the at least one connection; and a subsequent recess that extends toward the land side and to a subsequent depth in the shell side, wherein the subsequent recess is encompassed by the first-recess footprint.

In Example 2, the subject matter of Example 1 optionally includes a semiconductive device above the land side, wherein the primary recess overlaps at least a part of the semiconductive device.

In Example 3, the subject matter of any one or more of Examples 1-2 optionally include a passive device in the subsequent recess, wherein the passive device is coupled to power and to ground within the subsequent recess; and a first device in the first recess, wherein the first device is coupled to power and to ground within the first recess, wherein the first device extends over at least a portion of the passive device.

In Example 4, the subject matter of any one or more of Examples 1-3 optionally include a passive device in the subsequent recess, wherein the passive device is coupled to power and to ground within the subsequent recess; a first device in the first recess, wherein the first device is coupled to power and to ground within the first recess, wherein the first device extends over at least a portion of the passive device; and a semiconductor device package substrate on the land side, wherein the first device and the passive device are coupled to the semiconductor device package substrate.

In Example 5, the subject matter of any one or more of Examples 1-4 optionally include a passive device in the subsequent recess, wherein the passive device is coupled to power and to ground within the subsequent recess; a first device in the first recess, wherein the first device is coupled to power and to ground within the first recess, wherein the first device extends over at least a portion of the passive device; a semiconductor device package substrate on the land side, wherein the first device and the passive device are coupled to the semiconductor device package substrate; and a semiconductive device on a die side of the semiconductor device package substrate.

In Example 6, the subject matter of any one or more of Examples 1-5 optionally include a passive device in the subsequent recess, wherein the passive device is coupled to power and to ground within the subsequent recess; a first device in the first recess, wherein the first device is coupled to power and to ground within the first recess, wherein the first device extends over at least a portion of the passive device; a semiconductor device package substrate on the land side, wherein the first device and the passive device are coupled to the semiconductor device package substrate; and a semiconductive device on a die side of the semiconductor device package substrate, and wherein the semiconductive device is part of a chipset.

In Example 7, the subject matter of any one or more of Examples 1-6 optionally include furthering including: a third recess that extends toward the land side and to a third depth in the shell side, wherein the third recess is encompassed by the first-recess footprint; a passive device in the subsequent recess, wherein the passive device is coupled to power and to ground within the subsequent recess; a first device in the first recess, wherein the first device is coupled to power and to ground within the first recess, wherein the first device extends over at least a portion of the passive device; a third device in the third recess, wherein the third device is coupled to power and to ground within the third recess; and an alternate first device in the primary recess wherein the alternate first device is coupled to power and to ground within the first recess, wherein the alternate first device extends over at least a portion of the third device.

In Example 8, the subject matter of any one or more of Examples 1-7 optionally include a third recess that extends toward the land side and to a third depth in the shell side, wherein the third recess is encompassed by the first-recess footprint; a passive device in the subsequent recess, wherein the passive device is coupled to power and to ground within the subsequent recess: a third device in the third recess, wherein the third device is coupled to power and to ground within the third recess; a first device in the first recess, wherein the first device is coupled to power and to ground within the first recess, wherein the first device extends over at least a portion of the subsequent device, and wherein the first device extends over at least a portion of the third device.

In Example 9, the subject matter of any one or more of Examples 1-8 optionally include a third recess that extends toward the land side and to a third depth in the shell side, wherein the third recess is encompassed by the first-recess footprint; a passive device in the subsequent recess, wherein the passive device is coupled to power and to ground within the subsequent recess; a third device in the third recess, wherein the third device is coupled to power and to ground within the third recess; and a first semiconductive device in the first recess, wherein the first semiconductive device is coupled to power and to ground within the first recess, wherein the first semiconductive device extends over at least a portion of the passive device, and wherein the first semiconductive device extends over at least a portion of the third device.

In Example 10, the subject matter of any one or more of Examples 1-9 optionally include a third recess that extends toward the land side and to a third depth in the shell side, wherein the third recess is encompassed by the first-recess footprint; a passive device in the subsequent recess, wherein the passive device is coupled to power and to ground within the subsequent recess; a third device in the third recess, wherein the third device is coupled to power and to ground within the third recess; a first semiconductive device in the first recess, wherein the first semiconductive device is coupled to power and to ground within the first recess, wherein the first semiconductive device extends over at least a portion of the passive device, and wherein the first semiconductive device extends over at least a portion of the third device; and a semiconductor device package substrate on the land side, wherein the first semiconductive device and the passive device are coupled to the semiconductor device package substrate.

In Example 11, the subject matter of any one or more of Examples 1-10 optionally include a passive device in the subsequent recess, wherein the passive device is coupled to power and to ground within the subsequent recess; a first semiconductive device on a flexible cable that contacts the shell side, wherein the first semiconductive device extends into the first recess; and a first device in the first recess, wherein the first device is a capacitor coupled to power within the primary recess and coupled to ground at the flexible cable, and wherein the first semiconductive device extends over at least a portion of the passive device.

In Example 12, the subject matter of any one or more of Examples 1-11 optionally include a passive device in the subsequent recess, wherein the passive device is coupled to power and to ground within the subsequent recess; a first semiconductive device on a flexible cable that contacts the shell side, wherein the first semiconductive device extends into the first recess; a first device in the first recess, wherein the first device is a capacitor coupled to power within the primary recess and coupled to ground at the flexible cable, and wherein the first semiconductive device extends over at least a portion of the passive device; and a semiconductor device package substrate on the land side, wherein the first semiconductive device and the passive device are coupled to the semiconductor device package substrate.

Example 13 is a semiconductor device package, comprising: a semiconductive device on a die side of a semiconductor device package substrate; a printed wiring board including a land side and a shell side, wherein the semiconductor device package substrate is coupled on the land side; a primary recess that extends toward the land side and to a first depth in the shell side, wherein the primary recess includes a first-recess footprint that projects to the land side to overlap at least a portion of the semiconductor device package substrate; a first device in the first recess, wherein the first device is coupled to the semiconductive device; a subsequent recess that extends toward the land side and to a subsequent depth in the shell side, wherein the subsequent recess is encompassed by the first-recess footprint; a capacitor in the subsequent recess, wherein the capacitor is coupled to the semiconductive device; a third recess that extends toward the land side and to a third depth in the shell side, wherein the subsequent recess is encompassed by the first-recess footprint; and a capacitor in the third recess, wherein the capacitor is coupled to the semiconductive device.

In Example 14, the subject matter of Example 13 optionally includes a capacitor in a fourth recess that extends toward the land side and to a fourth depth in the shell side, wherein the fourth recess is encompassed by the first-recess footprint.

In Example 15, the subject matter of any one or more of Examples 13-14 optionally include wherein the first device in the primary recess is a memory chip suspended from the first recess.

In Example 16, the subject matter of any one or more of Examples 13-15 optionally include wherein the first device in the primary recess is a memory chip, further including; a flexible cable on the shell side, wherein the first device in the primary recess is coupled to the flexible cable; and a first capacitor in the first recess, wherein the first capacitor is coupled to power within the primary recess, and wherein the first capacitor is coupled to ground at the flexible cable.

In Example 17, the subject matter of any one or more of Examples 13-16 optionally include wherein the first device in the primary recess is a capacitor.

Example 18 is a method of forming a printed wiring board, comprising: opening a primary recess in a shell side of a printed wiring board, to a first depth, wherein opening the recess exposes at least one power and one ground connection; opening a subsequent recess in the primary recess that extends toward the land side and to a subsequent depth in the shell side, wherein opening the subsequent recess exposes at least one power and one ground connection; assembling a first device in the primary recess and coupling to the at least one power and at least one ground connection; and assembling a subsequent device in the subsequent recess and coupling to the at least one power and ground connection.

In Example 19, the subject matter of Example 18 optionally includes coupling a semiconductive device to the first device and the subsequent device.

In Example 20, the subject matter of any one or more of Examples 18-19 optionally include opening a third recess in the primary recess that extends toward the land side and to a third depth in the shell side, wherein opening the third recess exposes at least one power and one ground connection; and seating a third device in the third recess. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A printed wiring board including a land side and a shell side, comprising:
at least one electrical connection on the land side;
a primary recess that extends toward the land side and to a first depth in the shell side, wherein the primary recess includes a first-recess footprint that projects to the land side to encompass the at least one connection;
a subsequent recess that extends toward the land side and to a subsequent depth in the shell side, wherein the subsequent recess is encompassed by the first-recess footprint;
a semiconductive device above the land side, wherein the primary recess overlaps at least a part of the semiconductive device;
a passive device in the subsequent recess, wherein the passive device is coupled to power and to ground within the subsequent recess; and
a first device, separate from the passive device, in the primary recess, wherein the first device is coupled to power and to ground within the primary recess, wherein the first device extends over at least a portion of the passive device.

2. The printed wiring board of claim 1, further including:
a semiconductive device above the land side, wherein the primary recess overlaps at least a part of the semiconductive device; and
a subsequent device in the subsequent recess, wherein the subsequent device is coupled to power and to ground within the subsequent recess; and a first device in the first depression, wherein the first device is coupled to power and to ground within the first depression, wherein the first device extends over at least a portion of the subsequent device.

3. The printed wiring board of claim 1, further including:
a passive device in the subsequent recess, wherein the passive device is coupled to power and to ground within the subsequent recess;
a first device in the first recess, wherein the first device is coupled to power and to ground within the first recess, wherein the first device extends over at least a portion of the passive device; and
a semiconductor device package substrate on the land side, wherein the first device and the passive device are coupled to the semiconductor device package substrate.

4. The printed wiring board of claim 1, further including:
a passive device in the subsequent recess, wherein the passive device is coupled to power and to ground within the subsequent recess;
a first device in the first recess, wherein the first device is coupled to power and to ground within the first recess, wherein the first device extends over at least a portion of the passive device;
a semiconductor device package substrate on the land side, wherein the first device and the passive device are coupled to the semiconductor device package substrate; and
a semiconductive device on a die side of the semiconductor device package substrate.

5. The printed wiring board of claim 1, further including:
a passive device in the subsequent recess, wherein the passive device is coupled to power and to ground within the subsequent recess;
a first device in the first recess, wherein the first device is coupled to power and to ground within the first recess, wherein the first device extends over at least a portion of the passive device;
a semiconductor device package substrate on the land side, wherein the first device and the passive device are coupled to the semiconductor device package substrate; and
a semiconductive device on a die side of the semiconductor device package substrate, and wherein the semiconductive device is part of a chipset.

6. The printed wiring board of claim 1, furthering including:
a third recess that extends toward the land side and to a third depth in the shell side, wherein the third recess is encompassed by the first-recess footprint;
a passive device in the subsequent recess, wherein the passive device is coupled to power and to ground within the subsequent recess;
a first device in the first recess, wherein the first device is coupled to power and to ground within the first recess, wherein the first device extends over at least a portion of the passive device;
a third device in the third recess, wherein the third device is coupled to power and to ground within the third recess; and
an alternate first device in the primary recess wherein the alternate first device is coupled to power and to ground within the first recess, wherein the alternate first device extends over at least a portion of the third device.

7. The printed wiring board of claim 1, further including:
a third recess that extends toward the land side and to a third depth in the shell side, wherein the third recess is encompassed by the first-recess footprint;
a passive device in the subsequent recess, wherein the passive device is coupled to power and to ground within the subsequent recess;
a third device in the third recess, wherein the third device is coupled to power and to ground within the third recess;
a first device in the first recess, wherein the first device is coupled to power and to ground within the first recess, wherein the first device extends over at least a portion of the subsequent device, and wherein the first device extends over at least a portion of the third device.

8. The printed wiring board of claim 1, further including:
a subsequent device in the subsequent recess, wherein the subsequent device is coupled to power and to ground within the subsequent recess;
a first device in the first depression, wherein the first device is coupled to power and to ground within the first depression, wherein the first device extends over at least a portion of the subsequent device; a semiconductor device package substrate on the land side, wherein the first device and the subsequent device are coupled to the semiconductor device package substrate; and a semiconductive device on a die side of the semiconductor device package substrate, and wherein the semiconductive device is part of a chipset;
a third recess that extends toward the land side and to a third depth in the shell side, wherein the third recess is encompassed by the first-depression footprint;
a subsequent device in the subsequent recess, wherein the subsequent device is coupled to power and to ground within the subsequent recess; a first device in the first depression, wherein the first device is coupled to power and to ground within the first depression, wherein the first device extends over at least a portion of the subsequent device; a third device in the third recess, wherein the third device is coupled to power and to ground within the third recess; and an alternate first device in the primary recess wherein the alternate first device is coupled to power and to ground within the first depression, wherein the alternate first device extends over at least a portion of the third device; and
a semiconductor device package substrate on the land side, wherein the first semiconductive device and the passive device are coupled to the semiconductor device package substrate.

9. The printed wiring board of claim 1, further including:
a third recess that extends toward the land side and to a third depth in the shell side, wherein the third recess is encompassed by the first-recess footprint;
a passive device in the subsequent recess, wherein the passive device is coupled to power and to ground within the subsequent recess;
a third device in the third recess, wherein the third device is coupled to power and to ground within the third recess; and
a first semiconductive device in the first recess, wherein the first semiconductive device is coupled to power and to ground within the first recess, wherein the first semiconductive device extends over at least a portion of the passive device, and wherein the first semiconductive device extends over at least a portion of the third device.

10. The printed wiring board of claim 1, further including:
a third recess that extends toward the land side and to a third depth in the shell side, wherein the third recess is encompassed by the first-recess footprint;
a passive device in the subsequent recess, wherein the passive device is coupled to power and to ground within the subsequent recess;
a third device in the third recess, wherein the third device is coupled to power and to ground within the third recess;
a first semiconductive device in the first recess, wherein the first semiconductive device is coupled to power and to ground within the first recess, wherein the first semiconductive device extends over at least a portion of the passive device, and wherein the first semiconductive device extends over at least a portion of the third device; and
a semiconductor device package substrate on the land side, wherein the first semiconductive device and the passive device are coupled to the semiconductor device package substrate.

11. The printed wiring board of claim 1, further including:
a passive device in the subsequent recess, wherein the passive device is coupled to power and to ground within the subsequent recess;
a first semiconductive device on a flexible cable that contacts the shell side, wherein the first semiconductive device extends into the first recess; and
a first device in the first recess, wherein the first device is a capacitor coupled to power within the primary recess and coupled to ground at the flexible cable, and wherein the first semiconductive device extends over at least a portion of the passive device.

12. The printed wiring board of claim 1, further including:
a passive device in the subsequent recess, wherein the passive device is coupled to power and to ground within the subsequent recess;
a first semiconductive device on a flexible cable that contacts the shell side, wherein the first semiconductive device extends into the first recess;
a first device in the first recess, wherein the first device is a capacitor coupled to power within the primary recess and coupled to ground at the flexible cable, and wherein the first semiconductive device extends over at least a portion of the passive device; and
a semiconductor device package substrate on the land side, wherein the first semiconductive device and the passive device are coupled to the semiconductor device package substrate.

13. A semiconductor device package, comprising:
a semiconductive device on a die side of a semiconductor device package substrate;
a printed wiring board including a land side and a shell side, wherein the semiconductor device package substrate is coupled on the land side;
a primary recess that extends toward the land side and to a first depth in the shell side, wherein the primary recess includes a first-recess footprint that projects to the land side to overlap at least a portion of the semiconductor device package substrate;
a first device in the first recess, wherein the first device is coupled to the semiconductive device;
a subsequent recess that extends toward the land side and to a subsequent depth in the shell side, wherein the subsequent recess is encompassed by the first-recess footprint;
a capacitor in the subsequent recess, wherein the capacitor is coupled to the semiconductive device;
a third recess that extends toward the land side and to a third depth in the shell side, wherein the third recess is encompassed by the first-recess footprint; and
a capacitor in the third recess, wherein the capacitor is coupled to the semiconductive device.

14. The semiconductor device package of claim 13, further including:
a capacitor in a fourth recess that extends toward the land side and to a fourth depth in the shell side, wherein the fourth recess is encompassed by the first-recess footprint.

15. The semiconductor device package of claim 13, wherein the first device in the primary recess is a memory chip suspended from the first recess.

16. The semiconductor device package of claim 13, wherein the first device in the primary recess is a memory chip, further including:
a flexible cable on the shell side, wherein the first device in the primary recess is coupled to the flexible cable; and
a first capacitor in the first recess, wherein the first capacitor is coupled to power within the primary recess, and wherein the first capacitor is coupled to ground at the flexible cable.

17. The semiconductor device package of claim 13, wherein the first device in the primary recess is a capacitor.

* * * * *